United States Patent
Boucey et al.

(10) Patent No.: US 9,500,681 B2
(45) Date of Patent: Nov. 22, 2016

(54) FET RF POWER DETECTOR

(71) Applicant: NXP B.V., Eindhoven (NL)

(72) Inventors: Claire Boucey, Caen (FR); Fabian Rivière, Cagny (FR); Sidina Wane, Caen (FR)

(73) Assignee: NXP B.V., Eindhoven (NL)

( * ) Notice: Subject to any disclaimer, the term of this patent is extended or adjusted under 35 U.S.C. 154(b) by 558 days.

(21) Appl. No.: 14/030,079

(22) Filed: Sep. 18, 2013

(65) Prior Publication Data

US 2014/0091814 A1     Apr. 3, 2014

(30) Foreign Application Priority Data

Oct. 1, 2012  (EP) .................................... 12290325

(51) Int. Cl.
  *G01R 21/00*   (2006.01)
  *H03F 3/45*    (2006.01)
  *H04B 17/318*  (2015.01)

(52) U.S. Cl.
  CPC ........... *G01R 21/00* (2013.01); *H03F 3/45197* (2013.01); *H04B 17/318* (2015.01)

(58) Field of Classification Search
  CPC .... H03F 3/45179; H03F 3/68; H03F 1/0266; H03F 1/0216; H03F 2200/18; H03F 1/02; H03F 2203/45112; H03F 2203/45154; H03F 1/3211; H03F 2200/435; H03F 3/3435; H03F 3/45098; G01R 21/00; G01R 21/12
  See application file for complete search history.

(56) References Cited

U.S. PATENT DOCUMENTS

| | | | | |
|---|---|---|---|---|
| 5,319,264 A * | 6/1994 | Kimura | .................. | H03G 7/001 327/104 |
| 6,727,754 B2 * | 4/2004 | Dupuis | ................. | H01L 23/645 330/133 |
| 7,777,552 B1 | 8/2010 | Gilbert | | |
| 2004/0183599 A1 | 9/2004 | Banba et al. | | |
| 2005/0127986 A1 | 6/2005 | Gilbert | | |
| 2008/0297256 A1 | 12/2008 | Eken et al. | | |
| 2010/0097143 A1 | 4/2010 | Eken et al. | | |
| 2011/0193550 A1 | 8/2011 | Eken et al. | | |
| 2013/0314156 A1* | 11/2013 | Kao | .......................... | H03F 3/45 330/254 |

FOREIGN PATENT DOCUMENTS

| | | |
|---|---|---|
| EP | 0 505 751 A2 | 9/1992 |
| GB | 2 280 052 A | 1/1995 |

OTHER PUBLICATIONS

Seevinck, E. et al. "A Versatile CMOS Linear Transconductor/Square-Law Function Circuit", IEEE Journal of Solid-State Circuits, vol. SC-22, No. 3, pp. 366-377 (Jun. 1987).

Gerosa, A. et al. "An Energy-Detector for Noncoherent Impluse-Radio UWB Receivers", IEEE Transactions on Circuits and Systems-I: Regular Papers, vol. 56, No. 5, pp. 1030-1040 (May 2009).

Extended European Search Report for Patent Appln. No. 12290325.5 (Mar. 28, 2013).

* cited by examiner

*Primary Examiner* — Vinh Nguyen

(57) ABSTRACT

An FET RF signal detector circuit comprising two unbalanced differential transistor pair circuits is disclosed. A current mirror output circuit is included for generating an output current derived from currents flowing in the differential transistor pair circuits. The first unbalanced differential transistor pair circuit comprises two branches, each with a respective tail, and a first variable resistor between the branch tails. The first unbalanced differential transistor pair circuit connects to a first current source tail arrangement. The second unbalanced differential transistor pair circuit comprises two branches, each with a respective tail, and a second variable resistor between the branch tails. The second unbalanced differential transistor pair circuit connects to a second current source tail arrangement.

11 Claims, 10 Drawing Sheets

FET RF POWER DETECTOR

CROSS-REFERENCE TO RELATED APPLICATIONS

This application claims the priority under 35 U.S.C. §119 of European patent application no. 12290325.5, filed on Oct. 1, 2012, the contents of which are incorporated by reference herein.

This invention relates to power detectors, for example for use in radio communications systems.

In radio communication systems, there are many benefits obtained by using high frequency power detection. In a transmission chain, a detector is used to monitor the output of a power amplifier (PA). This is necessary for example to conform to current standards, optimize network coverage, detect an impedance mismatch at the antenna, avoid overheating problems, improve reliability or moderate interference with neighbouring systems.

In mobile phones or other mobile wireless products, ensuring a level just sufficient for transmission power will also lead to substantial power savings, and power detection can be used as a feedback control parameter for this purpose.

Figure 1:
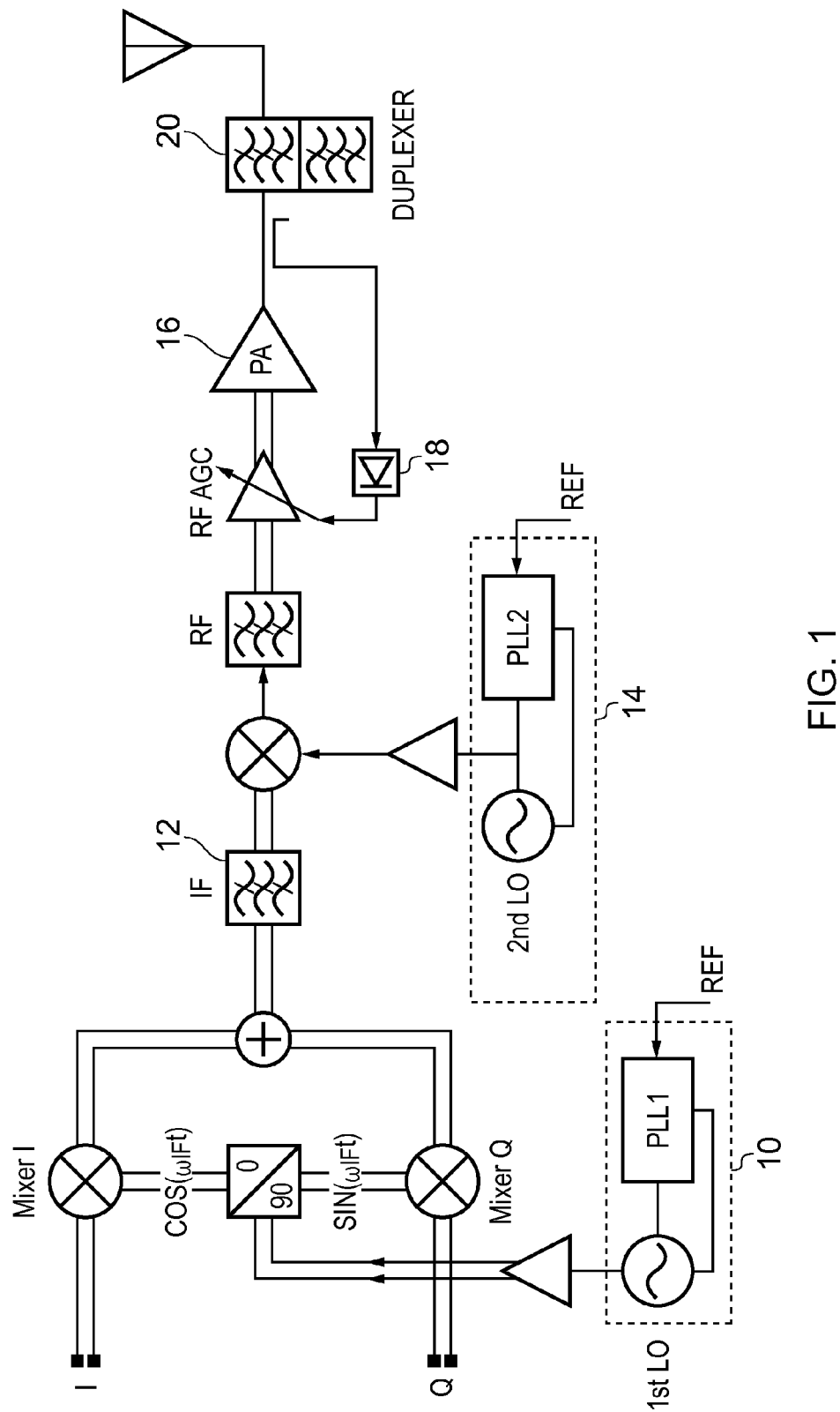

FIG. 1 shows an example of a transmitter chain including an RF detector. The transmitter comprises a first local oscillator 10 at intermediate frequency (IF). Quadrature input signals (I and Q) are modulated onto 90 degree phase shifted version of the IF carrier by mixers (Mixer I and Mixer Q). After filtering by an IF filter 12, there is mixing with the RF carrier from a second local oscillator 14.

After RF filtering, there is amplification using an amplifier 16 with an AGC loop. This AGC loop uses a power detector 18 (providing a transmitted signal strength indication of the RF signal). The RF signal is transmitted via a duplexer 20.

Figure 2:
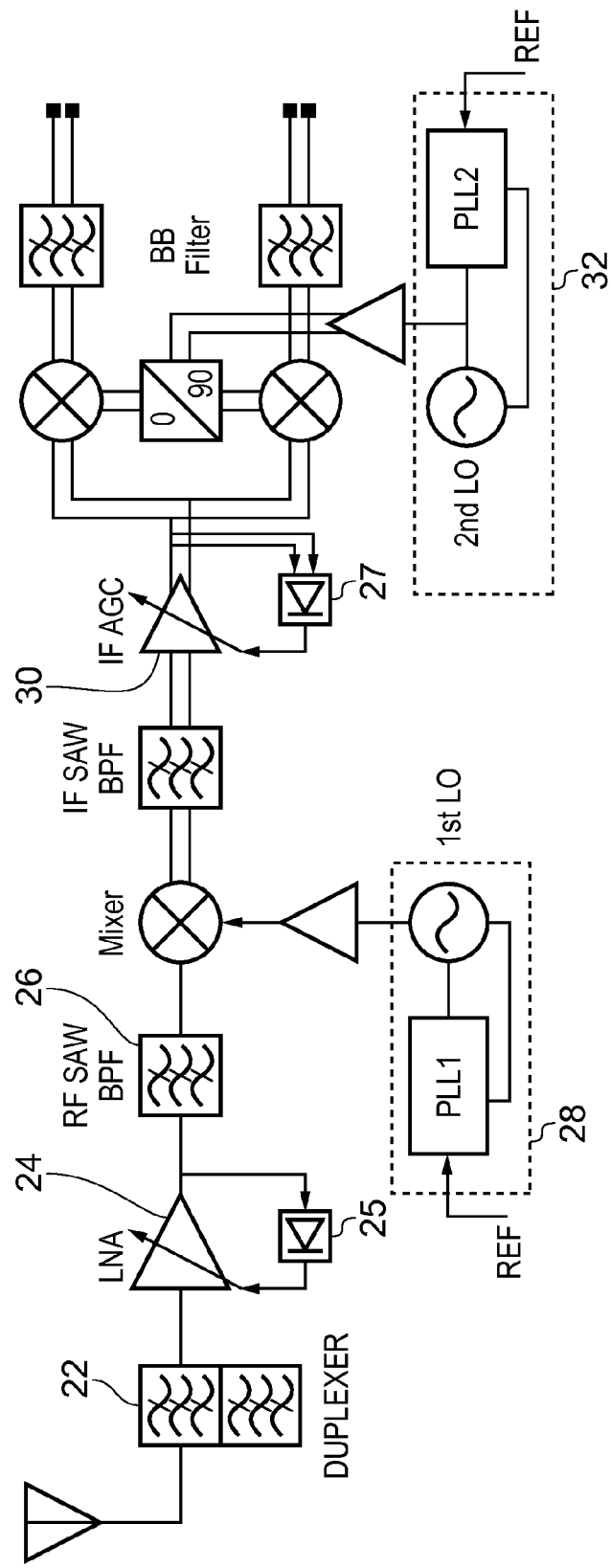

FIG. 2 shows an example of a receiver chain including an RF detector. The RF signal is received via duplexer 22, and is amplified by a low noise amplifier (LNA) 24. This has an RF detector 25 for AGC control.

After band pass filtering by RF filter 26, the signal is downconverted to IF by a mixer and a first RF local oscillator 28. After IF band pass filtering, the signal is amplified by an IF variable gain amplifier 30 with an IF detector 27 used for AGC loop detection.

The I and Q components are then generated by mixing 90 degree phase shifted versions of the output from a second local oscillator 32. The I and Q signals are at baseband and are filtered.

The RF detector (in both circuits) provides an indication of the strength of signal received by or provided to the antenna. For example, by using the RSSI (received signal strength indication) function, the gain of the receiver can then be adjusted accordingly through an AGC (automatic gain control): a procedure that maintains an optimal sensitivity and selectivity.

The invention relates particularly to detector architectures that can be implemented using pure FET/MOS processes. This offers many advantages compared to bipolar technologies, including:

(i) fine digital error calibration enabled by a cost effective digital calibration engine, with no need for more costly laser trimming calibration (ii) the ability to provide information in digital format for advanced digital post-processing (iii) more efficient RSSI and TSSI functions (iv) more robust AGC strategy (v) the detector can be stand alone or can be embedded within the RF transceiver (vi) cost efficient implementation (vii) technology node trend following (viii) for RMS power detection, the mathematical square function is required, which is the intrinsic MOSFET characteristic, when working in saturated mode. Conversely bipolar transistor based detectors need more complex circuitry to extrapolate the square function from a combination of exponential functions.

U.S. Pat. No. 5,319,264 discloses a FET logarithmic power detector which uses squaring full wave rectifier detector circuits. These detectors are used in an amplifier comprising a cascade arrangement of amplifiers. Before each amplifier, a detector circuit is used to measure the signal strength. The dynamic range of the overall detection is improved, because different detectors are used for different signal level ranges in the input. Each detector has an output which is optimum (not saturated or clipped) only for a particular input signal range. Thus, by adding the detection signals from all the detectors, an overall signal power indication is obtained Each individual detector in U.S. Pat. No. 5,319,264 comprises two unbalanced differential pair circuits designed to provide good logarithmic characteristics.

The new technology nodes open the door to the use of such circuitry at high frequencies, whereas until now the cascaded logarithmic amplifiers were almost exclusively dedicated to applications of low intermediate frequencies (IF).

However, carrier mobility degradation can result in performance deterioration, and this is particularly relevant for newer technologies due to the decrease of the channel length.

According to the invention, there is provided a FET RF signal detector circuit comprising:

a first unbalanced differential transistor pair circuit;

a second unbalanced differential transistor pair circuit;

a current mirror output circuit for generating an output current derived from currents flowing in the differential transistor pair circuits;

wherein the first unbalanced differential transistor pair circuit comprises two branches, each with a respective tail, and a first variable resistor between the branch tails, wherein the first unbalanced differential transistor pair circuit connects to a first current source tail arrangement; and wherein the second unbalanced differential transistor pair circuit comprises two branches, each with a respective tail, and a second variable resistor between the branch tails, wherein the second unbalanced differential transistor pair circuit connects to a second current source tail arrangement.

The use of two unbalanced differential pairs is known for logarithmic power detection. The invention improves the circuit performance by introducing a variable resistor between the branch tails in each unbalanced pair. The invention thereby enables a high frequency power detector to be formed based on a logarithmic amplifier using exclusively FET/MOS technology.

The detector structure allows the detection level to be adjusted by calibration. This provides an additional degree of freedom to achieve a fine and accurate calibration with digital post-processing.

The circuit can be provided in standalone form or it can be provided as an embedded feature in RF IC's, for example for mobile telephony base station applications.

In one example, the tails of the first unbalanced differential transistor pair circuit each connect to a respective current source of the first current source arrangement, and the tails of the second unbalanced differential transistor pair circuit each connect to a respective current source of the second current source arrangement. Thus, each branch has its own current source, with variable resistors between the current source pairs.

The first unbalanced differential transistor pair circuit can comprise a first transistor and a first current source in the first branch and a second transistor and a second current source in the second branch, with the second transistor having a W/L ratio K times that of the first transistor Similarly, the second unbalanced differential transistor pair circuit can comprise a third transistor and a third current source in the first branch and a fourth transistor and a fourth current source in the second branch, with the fourth transistor having a W/L ratio K times that of the third transistor In another example, the tails of the first unbalanced differential transistor pair circuit each connect to a current source of the first current source arrangement through respective variable resistors, and the tails of the second unbalanced differential transistor pair circuit each connect to a current source of the second current source arrangement through respective variable resistors. In this example, each differential pair has one current source, but the tails of the branches connect to the current source through a variable resistor.

The current mirror output circuit can comprise a transistor arrangement for deriving a sensor current which is based on the difference between the total current in the two first branches and the total current in the two second branches. This sensor current enables a mean square logarithmic power detector to be formed. The current mirror output circuit can further comprise a current mirror arrangement for generating an output current as the difference between the current of a current source and the sensor current. This provides a detector with a positive conversion gain.

The invention also provides a FET RF signal detector arrangement comprising:
  a cascaded set of amplifiers;
  a detector circuit of the invention at the output of each amplifier; and
  a summation unit for summing the detector outputs.

The arrangement can comprise an attenuator, a first subset of the amplifiers in cascade after the attenuator as a first cascade branch and a second subset of the amplifiers in cascade after the input as a second cascade branch.

Figure 3:
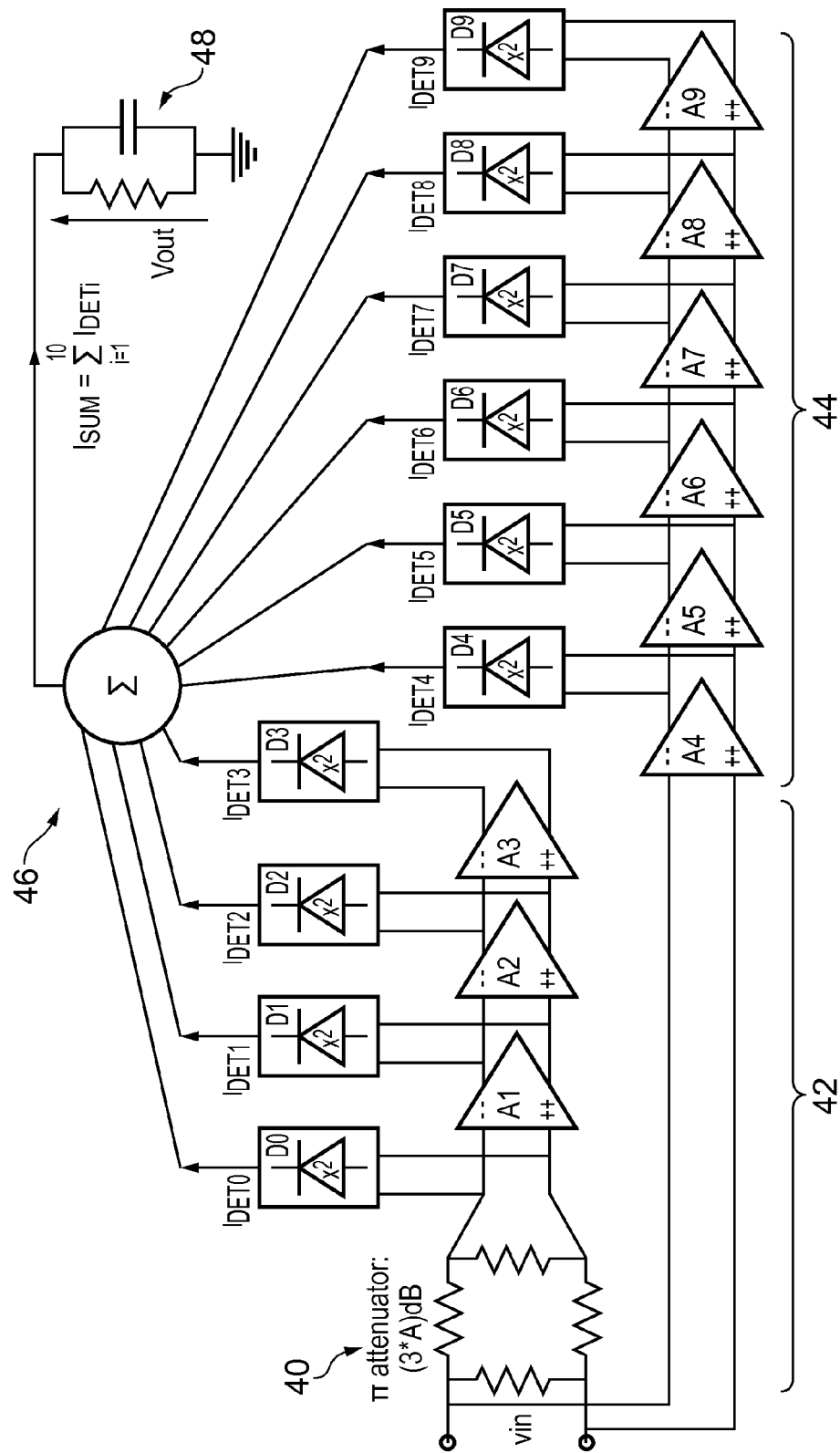
Figure 4:
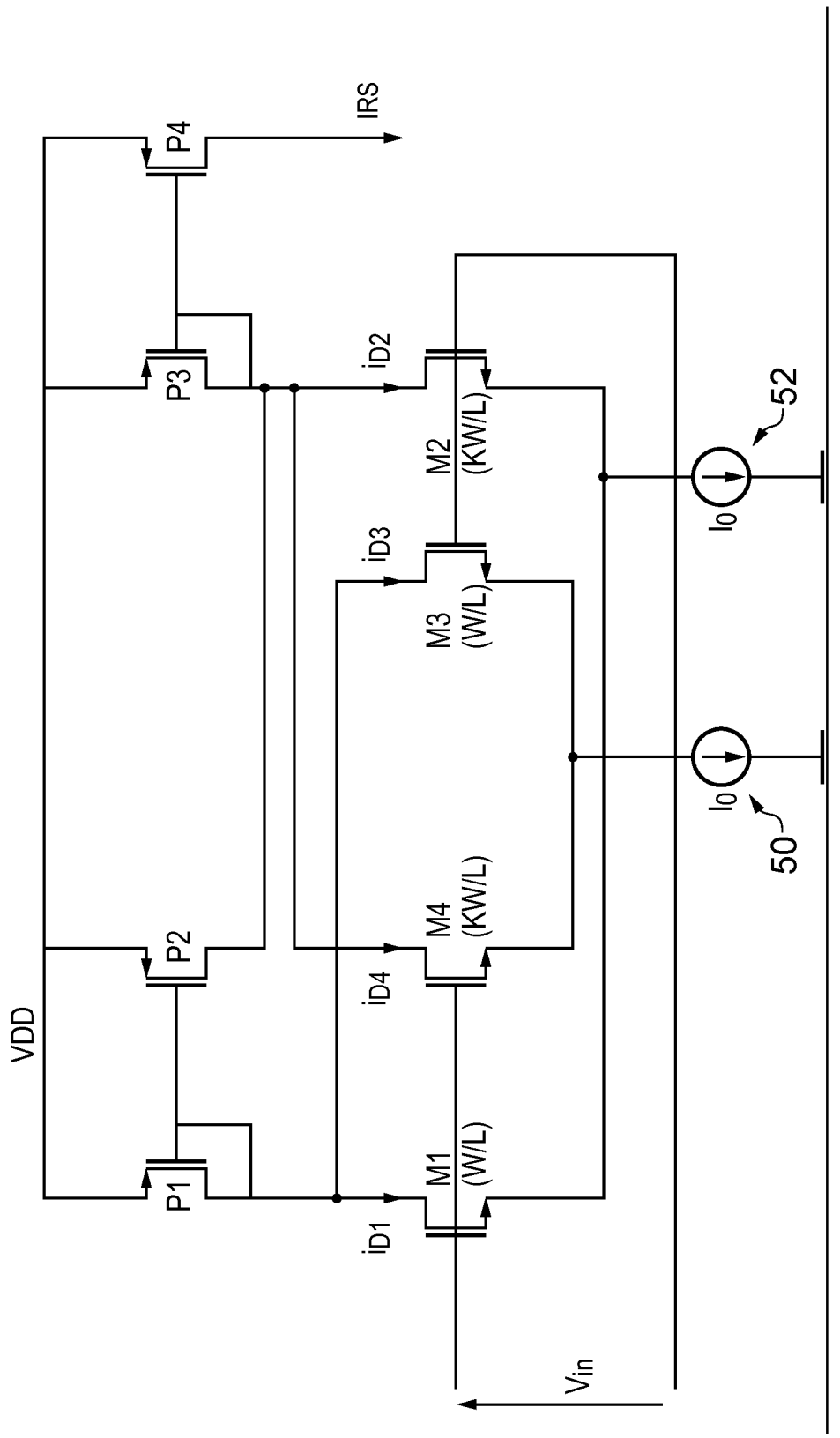
Figure 5:
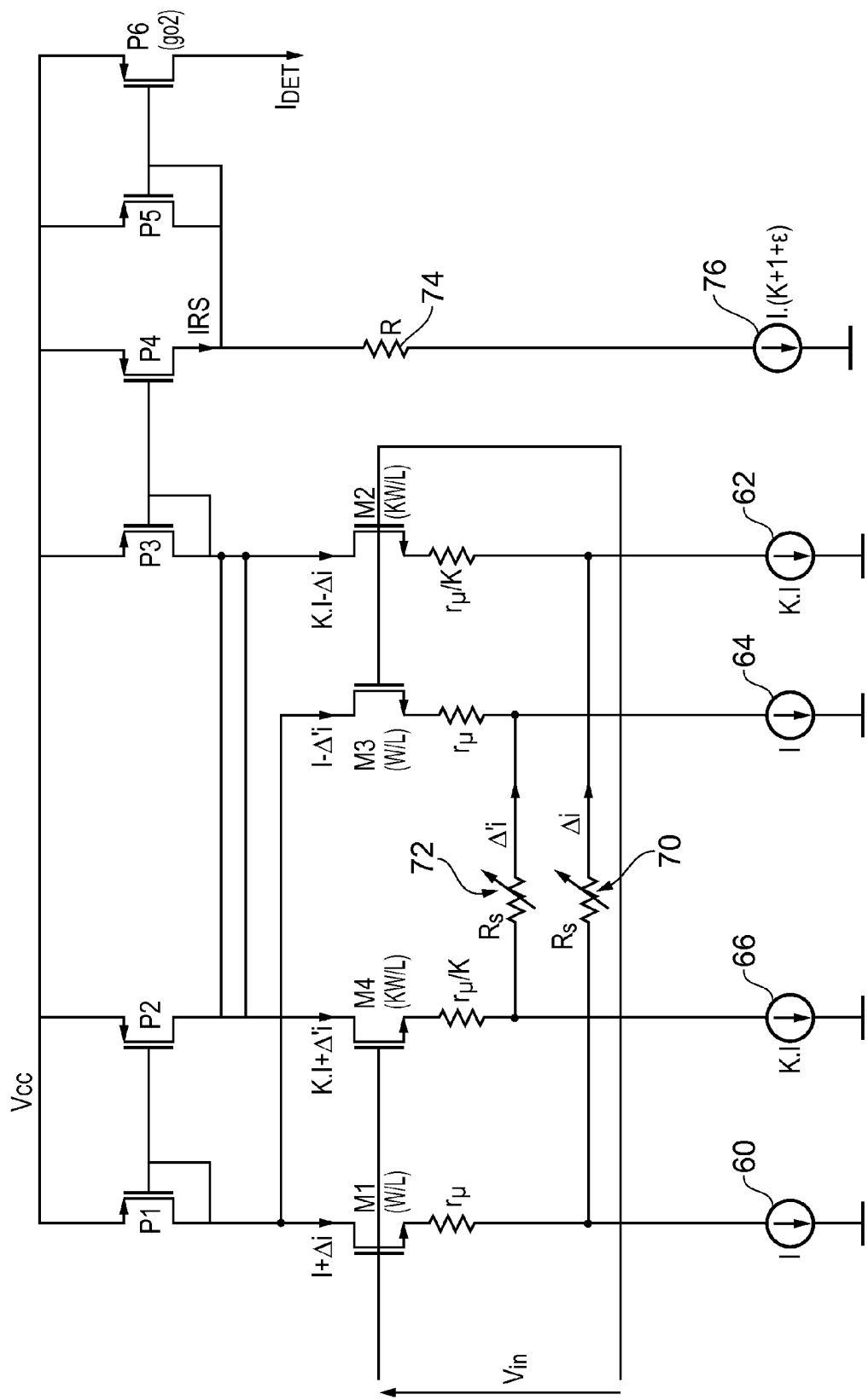
Figure 6:
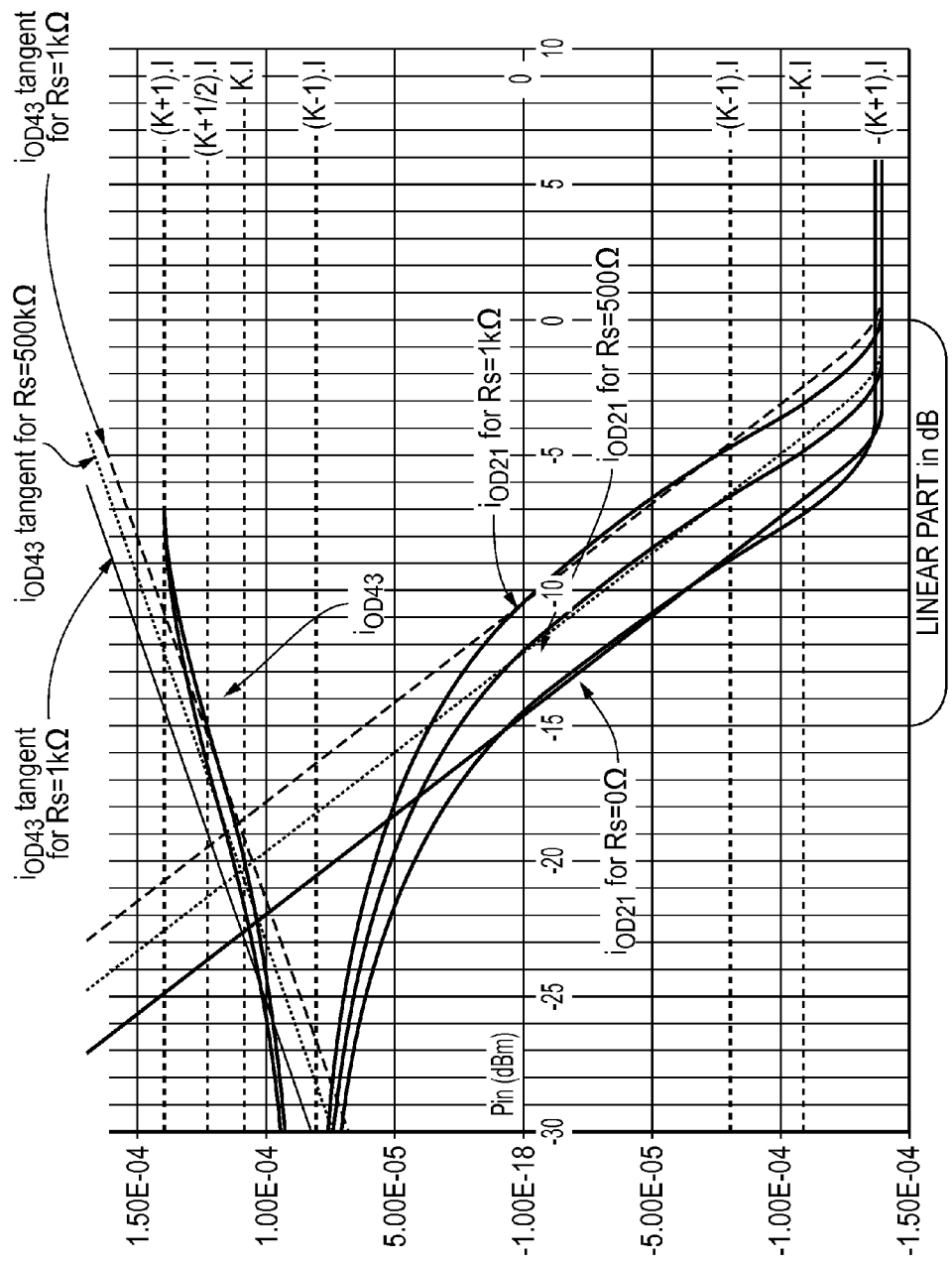
Figure 7:
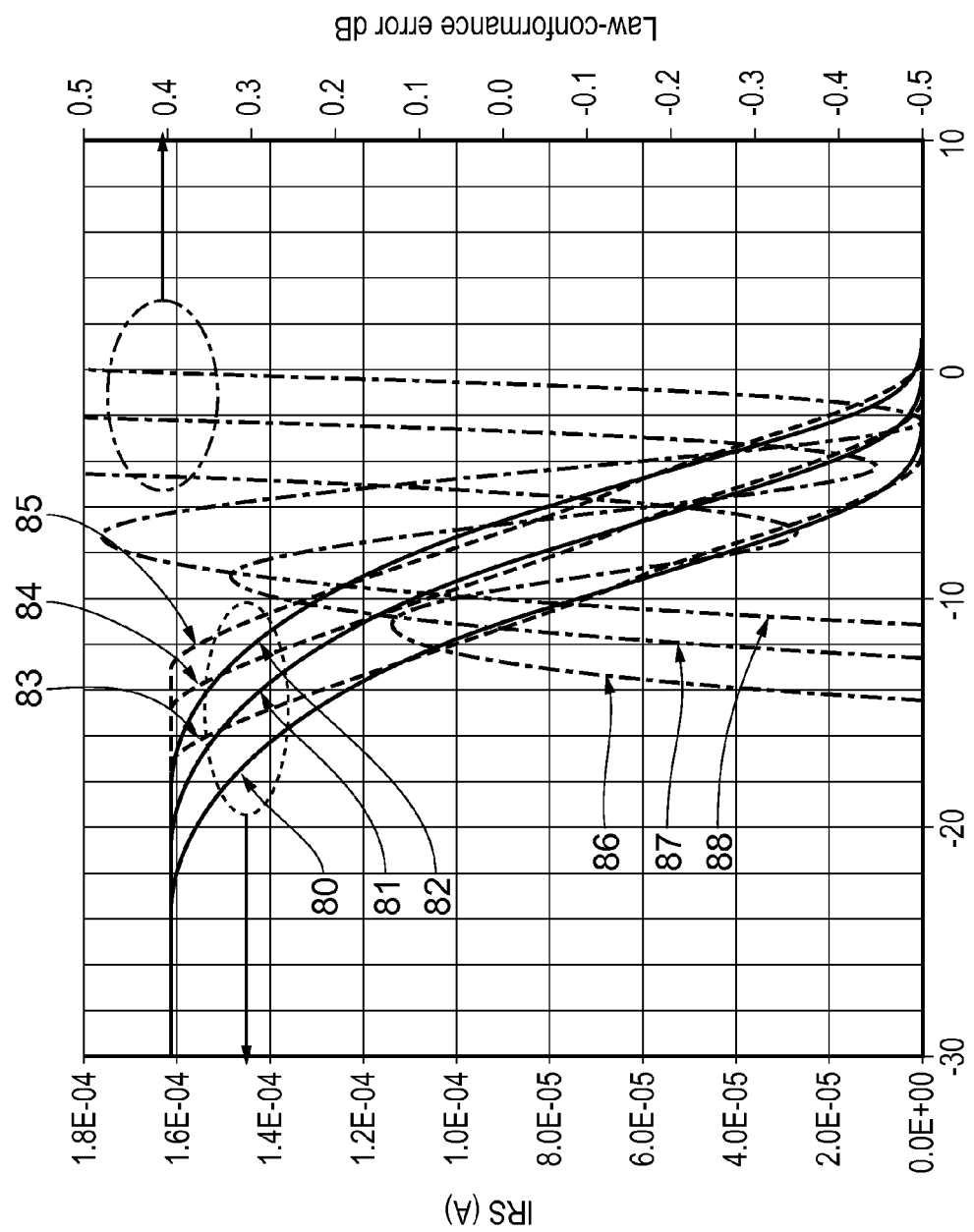
Figure 8:
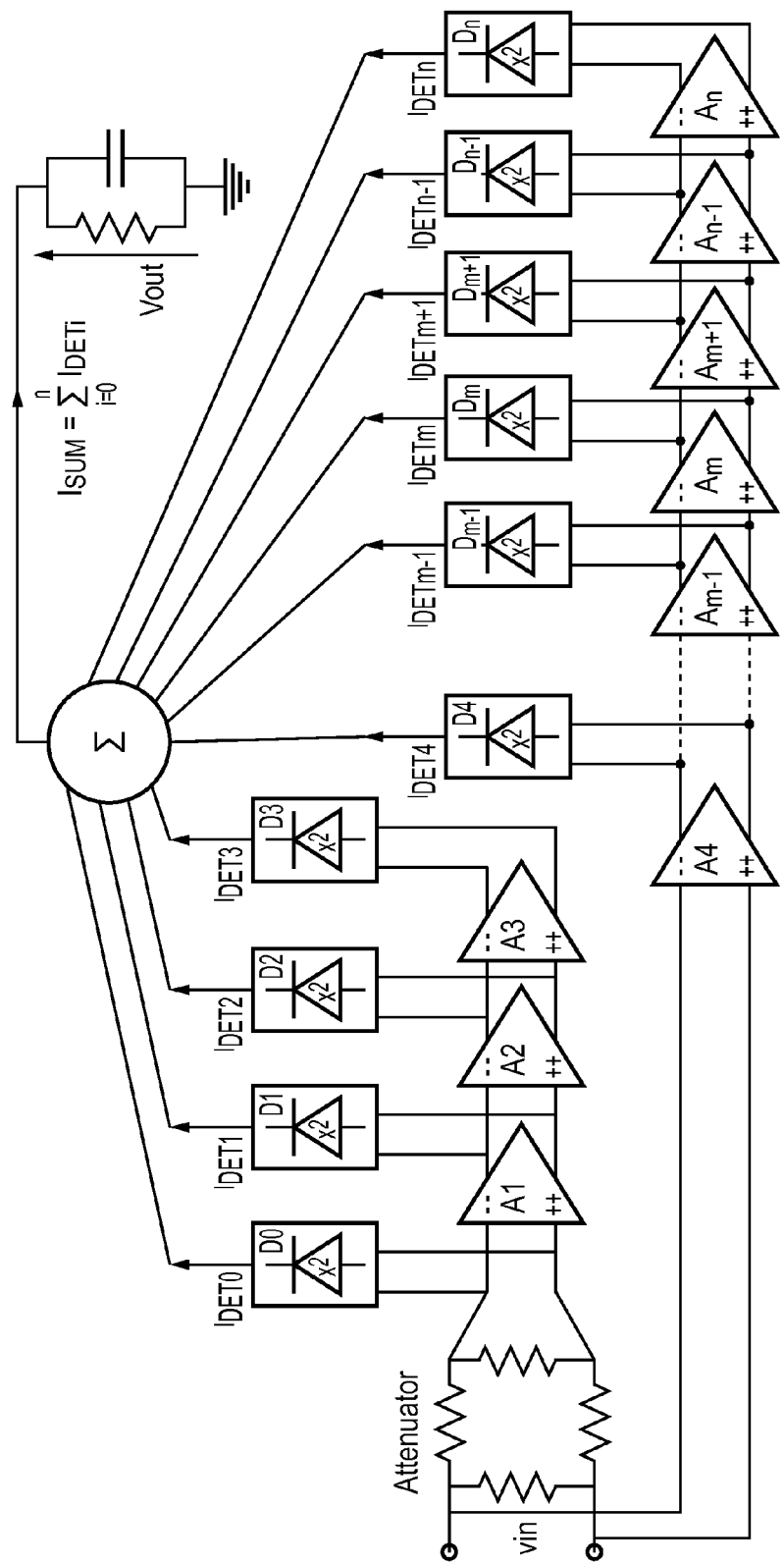
Figure 9:
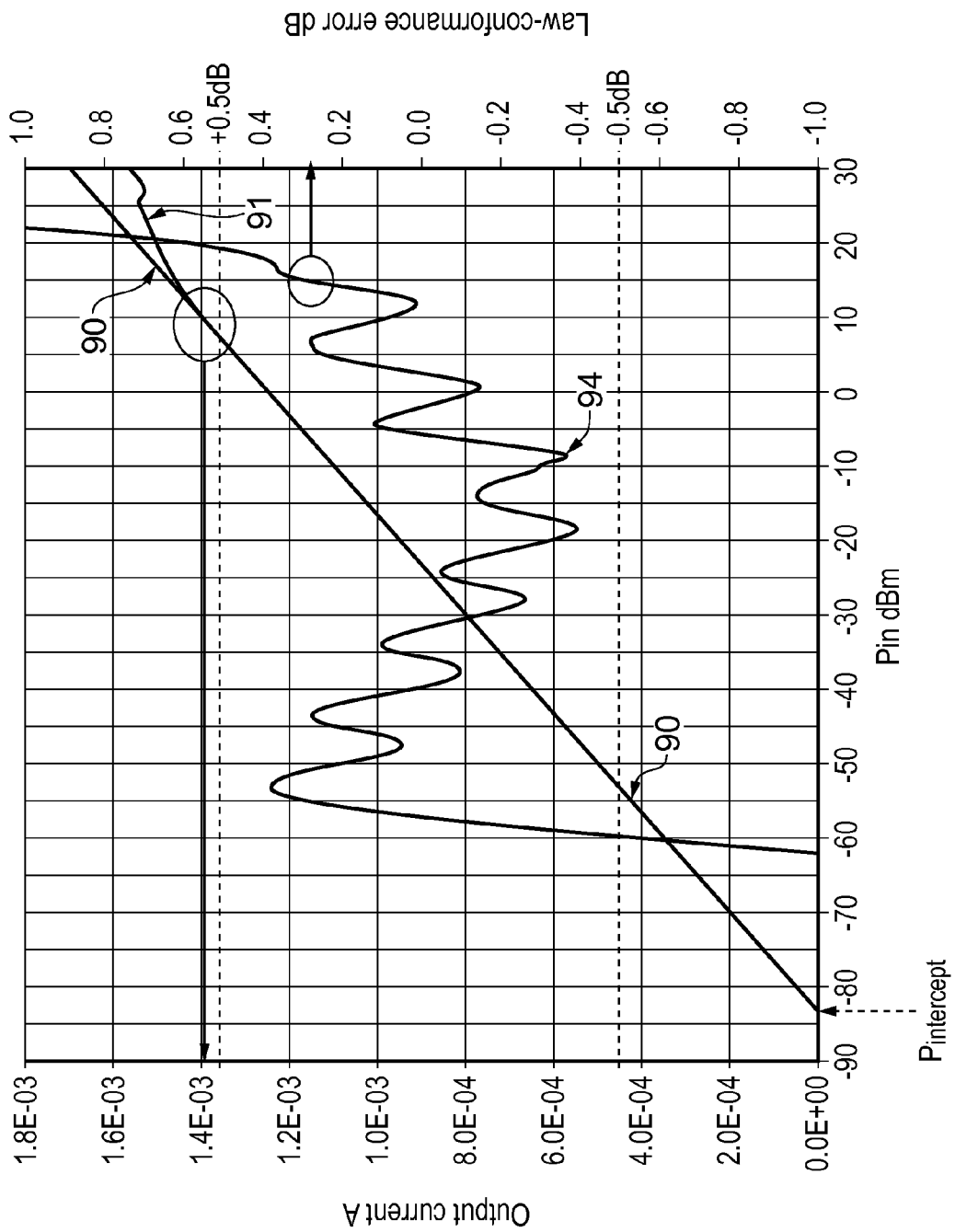
Figure 10:
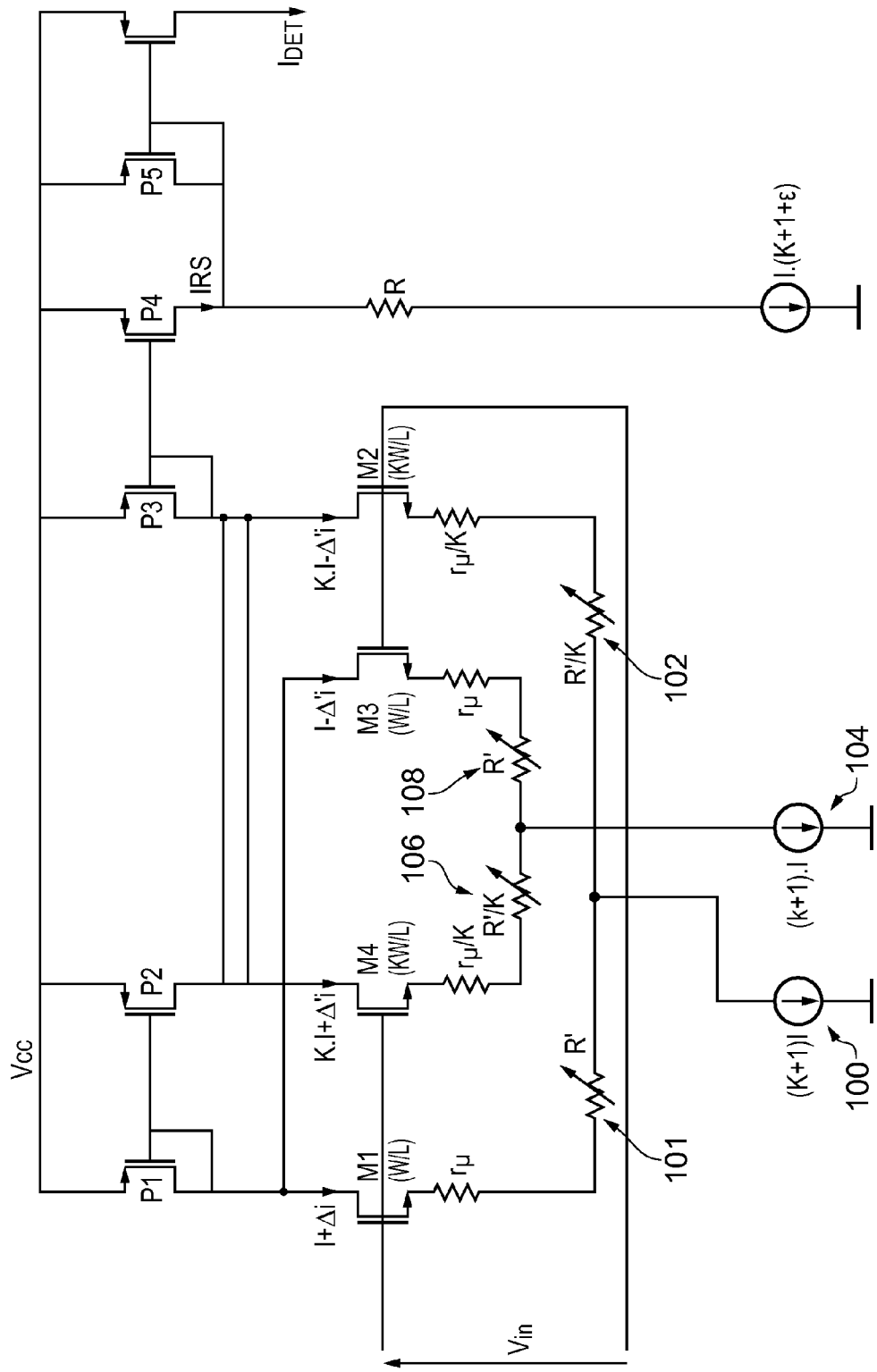

An example of the invention will now be described in detail with reference to the accompanying drawings, in which:

FIG. 1 shows a transmission chain using RF detection;
FIG. 2 shows a reception chain using RF detection;
FIG. 3 shows cascade amplifier arrangement of the invention used for signal level detection;
FIG. 4 shows a known detector circuit for example for use in the arrangement of FIG. 3;
FIG. 5 shows a first example of detector circuit of the invention for example for use in the arrangement of FIG. 3;
FIG. 6 is used to explain the analysis of the circuit function;
FIG. 7 shows the performance of the circuit of FIG. 5;
FIG. 8 shows a generalised multi-stage amplifier for RF signal detection which can use the detector of the invention;
FIG. 9 shows the transfer function of the detector of the invention; and
FIG. 10 shows a second example detector circuit of the invention for example for use in the arrangement of FIG. 3.

The invention provides an FET RF signal detector circuit comprising two unbalanced differential transistor pairs, each having a variable resistor between a pair of tails of the differential pair. This provides improved circuit performance as well as enabling a calibration function.

FIG. 3 shows a high frequency FET power detector with a wide dynamic range in accordance with the invention.

FIG. 3 shows an input signal Vin which is applied to an attenuator 40 at the front of a first amplifier chain 42. This amplifier chain is for detection of strong RF power, and comprises three series connected differential amplifiers A1 to A3 (three is given as an example, but the number of amplifiers can be higher or lower). A detector D0 is provided at the input, and detectors are provided at the output of each amplifier (amplifier A1 has detector D1 at its output, amplifier A2 has detector D2 at its output and amplifier A3 has detector D3 at its output). The detectors generate detector currents $I_{DET0}$ to $I_{DET3}$.

The input signal Vin is also applied to a second amplifier chain 44. This amplifier chain is for detection of weak RF power, and comprises six series connected differential amplifiers A4 to A9 (again this is given as an example, but the number of amplifiers can change according the dynamic range needed). A detector Dn is again provided at the output of each amplifier An. The detectors generate detector currents $I_{DET4}$ to $I_{DET9}$.

Each detector D0 to D9 is thus associated with a particular RF signal power level. The signal power level associated with the optimum operating range of one detector will correspond to saturation of the next detector and "sleeping" of the preceding detector. The saturation corresponds to a fixed maximum detector current and "sleeping" corresponds to a fixed minimum detector current.

The detector currents are summed and integrated (or filtered) by adder 46 and converted to an output voltage by output stage 48. The summed detector current provides a signal level detection with wide dynamic range.

Cascaded detection approaches are known, for example from U.S. Pat. No. 5,319,264, US 2011/0193550, US2005/0127986 and US2010/0097143. To accommodate large input signals, the power detector system includes one series of progressively amplified stages and a second series of progressively "distributed" attenuator stages. The number of attenuators and amplified stages depends on the total input signal range required. Generally, the attenuators are distributed all along the signal path.

In FIG. 3, a single attenuator is used, which is put in the front-end part.

The amplifier that precedes each detector prevents overload and ensures response of the detector that maintains a good precision over the entire chain of detection. For example, in the case of high input power, the detector can have undesirable behavior when not protected by an amplifier when it is operating in its clipped mode.

The invention relates generally to cascaded detectors, and implemented purely with FET (e.g. MOSFET) process technology.

With the latest technology, it is now possible to produce structures such as cascaded logarithmic amplifiers operating at high frequencies. In the past these architectures were dedicated for low IF (intermediate frequency) applications.

This invention relates in particular to the design of the detectors D0 to D9 to enable high frequency operation.

As mentioned above, U.S. Pat. No. 5,319,264 discloses a squaring full-wave rectifier based on FET technology, as shown in FIG. 4.

The detector circuit comprises a first unbalanced differential transistor pair M1, M2. The first differential pair comprises a first branch provided between power rails VDD and ground with a first FET transistor M1, and a second branch provided between the power rails VDD and ground with a second FET transistor M2. A first current ID1 passes through transistor M1 and a second current ID2 passes through transistor M2. The two branches are connected to ground by a first bias current source 50. The connections to the current source 50 can be considered to be the tails of the two branches.

A second unbalanced differential transistor pair comprises transistors M3,M4. The second differential pair comprises a third branch provided between the power rails VDD and ground with third FET transistor M3, and a fourth branch provided between the power rails VDD and ground with a fourth FET transistor M4. A third current ID3 passes through transistor M3 and a fourth current ID4 passes through transistor M4. The two branches are connected to ground by a second bias current source 52. Again, the connections to the current source 50 can be considered to be the tails of the two branches.

Each differential pair M1,M2 and M3,M4 has one transistor gate connected to one input voltage terminal and the other transistor gate connected to the other input voltage terminal. Thus, a differential input voltage is provided across the gates of the two transistors of each differential pair. There is a W/L ratio between the transistors of the differential pair. As shown, M2 has a W/L ratio of K times that of M1, and similarly, M4 has a W/L ratio of K times that of M3, where W/L is the ratio of a gate width to a gate length of transistors used in the differential pairs.

For each branch, the transistors of the differential pair are at the bottom of the branch. The top of each branch has a current mirror input transistor. The current mirror transistors together provide an output current IRS which satisfies:

$$IRS=(ID2+ID4)-(ID1+ID3).$$

Current mirror transistor P1 is at the top of the first and third branch, i.e. IP1=ID1+ID3.

Current mirror transistor P2 mirrors P1.

Current mirror transistor P3 is at the top of the second and fourth branch, but current IP1 is added to it before it supplies those branches, i.e. IP3+IP1=ID2+ID4.

Current mirror transistor P4 mirrors P3 and provides the output current, i.e. IRS=IP3=ID2+ID4−IP1=(ID2+ID4)−(ID1+ID3).

The output is thus the difference in current between the two branches, summed for the two different pairs.

The characteristic equation of this circuit is represented by output current IRS given by Equation 1:

$$\boxed{IRS = (i_{D2} + i_{D4}) - (i_{D1} + i_{D3}) = 2 \cdot \frac{K-1}{K+1} I_0 - 4 \cdot \beta \cdot \frac{K \cdot (K-1)}{(K+1)^2} \cdot v_{in}^2}$$

With:

$$\beta = \frac{1}{2}\mu_N, C_{ox}\frac{W}{L}$$

and where $\mu_N$ is the mobility of the transistors M1, M2, M3 and M4, $C_{OX}$ is the gate capacitance of the gate oxide film per unit area and K the transistor size ratio for each unbalanced differential pair and explained by the following equation:

$$K = \left(\frac{W}{L}\right)_{M2} \bigg/ \left(\frac{W}{L}\right)_{M1} = \left(\frac{W}{L}\right)_{M4} \bigg/ \left(\frac{W}{L}\right)_{M3} > 1$$

The output current IRS is proportional to the squared input voltage according to Equation 1.

The derivation of these characteristic equations is provided in U.S. Pat. No. 5,319,264.

In practice there is a significant discrepancy with theory due to carrier mobility degradation. Indeed, carrier mobility degradation was negligible for old technologies and for this reason, this parameter is not taken into account in the equations.

With current advanced technologies, the effect of the mobility reduction cannot be neglected because it leads to substantial detector response modification.

This effect can be represented by a transistor source degeneration resistor (rμ), as explained in the article "A versatile CMOS Linear Transconductor/Square-Law Function Circuit" of Ever Seevinck et al., IEEE Journal of Solid-State Circuits, vol sc-22, No. 3, June 1987.

FIG. 5 shows a first example of detector circuit of the invention.

FIG. 5 uses the same references as FIG. 4 for the same circuit components.

Instead of providing the two branches of each unbalanced differential pair to a common bias current source, each branch has its own current source. Thus each branch has its tail connected to a respective current source.

For the first unbalanced differential pair, the branch with transistor M1 connects to current source 60 and the branch with transistor M2 connects to current source 62. Current source 62 delivers K times that of current source 60 to match the unbalanced differential pair.

$$v_{IN} = \sqrt{\frac{(K+1)\cdot I - i_{OD21}}{2\beta'}} - \sqrt{\frac{(K+1)\cdot I - i_{OD21}}{2K\beta'}} + \left(r_\mu \cdot \left(\frac{K+1}{K}\right) + R_S\right) \cdot \left(\frac{I \cdot (K-1) - i_{OD21}}{2}\right)$$

$$v_{IN} = \sqrt{\frac{(K+1)\cdot I - i_{OD43}}{2K\beta'}} - \sqrt{\frac{(K+1)\cdot I - i_{OD43}}{2\beta'}} + \left(R_S + r_\mu\left(\frac{K+1}{K}\right)\right) \cdot \left(\frac{(1-K)I + i_{OD43}}{2}\right)$$

A first variable resistor 70 is provided between the tails of the two branches.

For the second unbalanced differential pair, the branch with transistor M3 connects to current source 64 and the branch with transistor M4 connects to current source 66. Current source 66 delivers K times that of current source 64 to match the unbalanced differential pair.

A second variable resistor 72 is provided between the tails of the two branches.

This circuit provides a full-wave rectifier including mobility effect reduction, and the adjustable resistors provide for process spread calibration This circuit enables a calibration process to be carried with a new degree of freedom to enable compensation of process spread effects.

The output stage is also modified. In order to provide an output current proportional to the detected input power, the previous output current IRS is subtracted from a current source 76 through a resistor 74. This resistor is added to protect the current source 76 and ensures that the drain source voltage does not exceed the limit allowed by the process. The resistor 74 can be removed if this voltage never exceeds the maximum rating voltage allowed by the process.

A further current mirror transistor P5 has a tail current which is set to guarantee a minimum transistor bias current in all conditions and thus a minimum detector output current $I_{DET}$. To ensure good accuracy of $I_{DET}$ it is important that its value never reaches zero. For this purpose an additional small current c is added to the current source.

The output current $I_{DET}$ and the previous output IRS are linked by Equation 2:

$$IRS = I \cdot (K+1+\varepsilon) - I_{DET}$$

The circuit of FIG. 5 gives rise to the following Equations 3 and 4:

With: $i_{OD21} = i_{DS2} - i_{DS1}$ and $i_{OD43} = i_{DS4} - i_{DS3}$

These two equations are transcendental equations and methods of finding solutions use numerical methods.

FIG. 6 is used to explain how the equations above can be solved, and shows $i_{OD21}$ and $I_{OD43}$ curves simulated and calculated taking into account $r\mu$ and Rs and their respective tangent (Pin is expressed in dBm for a reference of 200Ω).

Three calculated plots (the dotted lines) and three simulated plots (the solid lines) of $i_{OD21}$ are shown for Rs=0Ω, Rs=500Ω and Rs=1 kΩ. Three simulated plots are shown for $i_{OD43}$ for the values Rs=0Ω, Rs=500Ω and Rs=1 kΩ. These overlap to such an extent that only one reference is provided generally to $i_{OD43}$. The simulated tangents are shown in dotted lines.

In the range of interest of the detector, where its response is linear in dB, as represented by the rectangle region, its response IRS follows the Equation 5:

$$I_{DET} = A \cdot \text{Pin} + B$$

By solving Equations 3 and 4, the advantages of the circuit can be seen. In particular, the current slope of the detector, when expressed as a function of the input power, is independent of the resistor value Rs. It is also not affected by the mobility reduction effect. Only the offset current is dependent on the value of these resistors which gives an additional degree of freedom for calibration of the system.

From equation 3, Vine is calculated and then expressed in dBV in Equation 6:

$$(v_{IN}^2)_{dBV} = 10 \cdot \log \cdot \left(\sqrt{\frac{(K+1)\cdot I - i_{OD21}}{2\beta'}} - \sqrt{\frac{(K+1)\cdot I + i_{OD21}}{2K\beta'}} + \left(r_\mu \cdot \left(\frac{K+1}{K}\right) + R_S\right) \cdot \left(\frac{I \cdot (K-1) - i_{OD21}}{2}\right)\right)^2$$

In this way, the output current increases when the detected input signal power increases (thus providing detector with a positive conversion gain).

The tangent of $i_{OD21}$ is calculated in its linear part by calculating Vin, for $i_{OD21} = -(K-1) \cdot I$ and for $i_{OD21} = 0$, as Equation 7:

$$\text{slope}_{iod21} = \frac{I \cdot (K-1)}{10 \cdot \left(\log\left(\left(K \cdot \sqrt{\frac{2I \cdot (K+1)}{\beta}} - \sqrt{\frac{2IK \cdot (K+1)}{\beta}} + I \cdot (K-1) \cdot (K \cdot R_s + (K+1) \cdot r_\mu)\right)^2\right) - \log\left(4(k-1)^2 \cdot \left(\sqrt{\frac{IK}{\beta}} + I(K \cdot R_S + (K+1) \cdot r_\mu)\right)^2\right)\right)}$$

So for, $-(K+1) \cdot I \leq i_{OD21} \leq (K-1) \cdot I$, $i_{OD21}$ a linearized (in dB) approximation of iod21 can be derived as follows as Equation 8:

$$i_{OD21-cal} = \text{slope}_{iod21} \cdot (v_{IN}^2)_{dBV} + \text{offset}_{iod21}$$

With the following Relationship 9:

$$\text{offset}_{iod21} = \frac{-I \cdot (K-1) \cdot \log\left(\frac{(K-1)^2 \cdot \left[I \cdot (K \cdot R_S + (K+1) \cdot r_\mu) + \sqrt{\frac{I \cdot K}{\beta}}\right]^2}{K^2}\right)}{\left(\log\left(\left(K \cdot \sqrt{\frac{2I \cdot (K+1)}{\beta}} - \sqrt{\frac{2IK \cdot (K+1)}{\beta}} + I \cdot (K-1) \cdot (K \cdot R_s + (K+1) \cdot r_\mu)\right)^2\right) - \log\left(4(k-1)^2 \cdot \left(I \cdot K \cdot R_S + \sqrt{\frac{IK}{\beta}} + I(K+1) \cdot r_\mu\right)^2\right)\right)} - I \cdot (K-1)$$

Due to the circuit architecture $i_{OD21-min} = -(K+1) \cdot I$ and $i_{OD21-max} = (K-1) \cdot I$.

For the same reason, minimum and maximum currents for $i_{OD43}$, will be equal respectively to $(K-1) \cdot I$ and $(K+1)I$.

From FIG. 6 (and FIG. 7 discussed below) it can be seen that IRS is linear in dB when $i_{OD43}$ has reached its maximum value of $(K+1)I$, so that, Equation 10 holds:

$$IRS_{calc} = (K+1)I + \text{slope}_{iod21} \cdot (vin^2)_{dBV} + \text{offset}_{iod21}$$

From Equation 7, the following can be derived as Equation 11:

$$\left(K \cdot \sqrt{\frac{2I \cdot (K+1)}{\beta}} - \sqrt{\frac{2IK \cdot (K+1)}{\beta}}\right) = \sqrt{2} \cdot \sqrt{\frac{IK}{\beta}} \left[-\sqrt{K+1} + \sqrt{K} \cdot \sqrt{K+1}\right] = \sqrt{2} \cdot \sqrt{\frac{IK}{\beta}} \cdot (\sqrt{K+1}) \cdot (\sqrt{K} - 1)$$

Using the Equality 12 below:

$$K - 1 = (\sqrt{K} - 1) \cdot (\sqrt{K} + 1) \Rightarrow \sqrt{K} - 1 = \frac{K-1}{\sqrt{K} + 1}$$

Equation 11 becomes Equation 13 below:

$$\sqrt{2} \cdot \sqrt{\frac{IK}{\beta}} \cdot \sqrt{K+1} \cdot (\sqrt{K} - 1) = \sqrt{2} \cdot \sqrt{\frac{IK}{\beta}} \cdot \sqrt{K+1} \cdot \frac{K-1}{1 + \sqrt{K}}$$

The denominator under the log bracket of Equation 7 can thus be replaced by Equation 14:

$$\left[\left[\frac{1}{2}\left[\frac{I \cdot (K \cdot R_s + (K+1) \cdot r_\mu) + \sqrt{\frac{I \cdot K}{\beta}} \cdot \sqrt{2} \cdot \frac{\sqrt{K+1}}{1+\sqrt{K}}}{I \cdot (K \cdot R_s + (K+1) \cdot r_\mu) + \sqrt{\frac{I \cdot K}{\beta}}}\right]\right]^2\right]$$

For good matching of the circuit, it can be assumed that that $2 \leq K \leq 8$.

This gives:

$$\sqrt{2} \cdot \frac{\sqrt{K+1}}{1 + \sqrt{K}} \approx 1.$$

Equation 6 can thus be simplified to Equation 15:

$$I_{OD21} \approx \frac{I(K-1)}{10 \cdot \log\left(\frac{1}{4}\right)} = \frac{I(K-1)}{(-6)}$$

and Equation 10 can be simplified to Equation 16:

$$I_{RS\_calc} \approx \frac{I(K-1)}{(-6)} \cdot (v_{in}^2)_{dBV} + (K+1) \cdot I + \text{offset}_{iod21}$$

$I_{DET\_calc}$ can be calculated as Equation 17:

$$I_{DET\_calc} = I(K+1+\varepsilon) - I_{RS\_calc}$$

$$I_{DET\_calc} = \frac{I(K-1)}{6} \cdot (v_{in}^2)_{dBV} + I \cdot \varepsilon - \text{offset}_{iod21}$$

Thus, the gain of the detector, independent of Rs and Rµ, is given by Equation 18:

$$G_{DET} = \frac{I(K-1)}{6}$$

As a conclusion, Equation 17 demonstrates that the power detector has a slope independent of Rs and Rµ, which follows the law $I_{DET}=A \cdot \text{Pin}_{(dBm)}+B$. The detector can be thus be fully calibrated by tuning two parameters "I" for the slope A and "Rs" for the offset B.

FIG. 7 illustrates the validity of the equations by comparing the theoretical characteristic with simulation results for three values of resistors Rs.

FIG. 7 shows the IRS current simulated (using "IRS" on the left y-axis legend), the calculated IRS current (using "IRS" on the left y-axis legend) and Law-Conformance-Error ("LCE" on right axis legend), taking into account the effect of the mobility reduction for three different source resistor values.

Plot 80 is a simulated IRS current result with Rs=0Ω
Plot 81 is a simulated result with Rs=500Ω
Plot 82 is a simulated result with Rs=1 kΩ
Plot 83 is a theoretical IRS calculated result with Rs=0Ω
Plot 84 is a calculated result with Rs=500Ω
Plot 85 is a calculated result with Rs=1 kΩ
Plot 86 is an LCE calculation with Rs=0Ω
Plot 87 is an LCE calculation with Rs=500Ω
Plot 88 is an LCE calculation with Rs=1 kΩ

The comparison is made in the linear-in-dB range of the detector with an ideal detector represented by a straight line characteristic. There is a good fit between equations and simulations.

The Law-Conformance-Error (LCE) quantifies discrepancies between simulated curves and equations in the linear-in-dB areas.

The improved property of this circuit, highlighted by its equations and verified by simulations, is that the current slope of the detector, when expressed as a function of the input power, is independent of the resistor value Rs. It is also not affected by the mobility reduction effect.

Only the offset current is dependent on the value of these resistors, which gives an additional degree of freedom for calibration of the system.

Outside this linear range, the detector is clamped by construction at its minimum or maximum current to enable the cascaded operation as explained above.

The dynamic range of the detector can be specified over an acceptable error (±0.5 dB in FIG. 7) and expressed by the law-conformance-error. It remains essentially the same whatever the source resistor value Rs (10 dB in FIG. 7).

The calculation of the error compared to an ideal detector (see FIG. 7), referred to the input, shows the useable range of the detector. This useable range is actually tunable according to the value of resistor RS, without affecting its conversion gain (GDET).

The detector unit can be included in a detection chain and duplicated as many times as necessary to achieve the required dynamic range as shown in FIG. 3. This system is based on a logarithmic amplifier structure.

Thus, different options are available for the distribution of amplifiers, detectors and the choice of the resistance value Rs.

To guarantee optimum performance of each unit detector, at a system level point of view (see FIG. 3), the amplifiers A1 to A9 improve signal integrity by providing to the detectors D1 to D8 the same environment.

This integrity is also ensured by the limiter characteristic of the amplifier that comes into play beyond the useful range of the detector. The circuit of the invention ensures the overall accuracy of the system for extreme signal level variations.

To generalise the principle and to show that a wider dynamic range is possible, the association of (n+1) detectors is shown in FIG. 8, which shows the full power detector including a front-end attenuator, n amplifiers and (n+1) detectors.

The current of all the detectors are again summed into a common resistor load. Thus, for n cascaded amplifier stages, with voltage gain, AdB each, (n+1) detectors will tap the signal at each node of the amplifier chain with a conversion gain GDET.

When considering the mth detector Dm working in its linear-in-dB range, then detectors D0 to Dm−1 deliver minimum current "I·(3−K+ε)" and Dm+1 to Dn are clamped to their maximum current "I(K+1+ε)", the sum of all the current detectors is given by Equation 19:

$$I_{SUM} = G_{DET}(\text{Pin}_{dBm} - P_{Intercept})$$

Equation 19 is illustrated in FIG. 9, showing simulation results of a power detector implemented in advanced FET technology, including 9 amplifiers and 10 detectors with a front-end attenuator of 30 dB (as in FIG. 3), and working at 3 GHz.

FIG. 9 shows the transfer function of the full squaring power detector showing an intercept point leading to the zero output current of −84 dBm at 3 GHz with a law-conformance error of ±0.5 dB for an input RF signal from −60 dBm to +20 dBm.

Plot 90 shows a linear calculation, plot 91 shows a simulation at 3 GHz and plot 94 shows the LCE.

The detector of the invention can for example be used in the chain of emission and reception for a base station or mobile device.

The detector can be used at high RF frequencies for example 1 GHz or more, and more generally from a few tens of MHz up to few GHz depending of the number of cascaded amplifiers.

As mentioned above, the detector circuit enables adjustment of the detection level by calibration of the offset level. This provides an additional degree of freedom to achieve a fine and accurate calibration by digital post-processing.

The calibration process can be carried out in two steps. The first is to adjust the gain of the detector by tuning the current "I". This can be done for example with no RF input signal and in this case IDET must be equal to:

$$I_{DET}(\min)=N \cdot I \cdot (3-K+\epsilon)$$

N is the number of detectors embedded in the system.

Once "I" is tuned and as a consequence the gain of the power detector, then the detection level can be shifted with respect to Pin by tuning Rs, knowing that $I_{DET}$ is linked to Rs by Equation 9 above.

This is just one possible way to implement calibration.

In the example above, the current shift caused by Rs varying from 0 to 3 kΩ is half of the dynamic range of a power detector unit. This offset is more than enough to compensate for process drifts.

FIG. 10 shows an alternative design which provides the same function.

The unbalanced branches are the same, and the same component names are used as in FIG. 5.

The current source arrangement and the variable resistor arrangement is different. The value R' shown in FIG. 10 is related to the value Rs in FIG. 5 by:

$$R'(1/K+1)=Rs.$$

In this circuit, the tails of the first unbalanced differential transistor pair (M1,M2) each connect to a shared current source 100 through respective variable resistors 101,102. Thus, a single current source is used for each differential pair. The tails correct to the shared current source through respective resistors which are scaled in the same proportion as the transistors of the unbalanced pair, i.e. R' and R'/K. K is the balance ratio of the unbalanced differential pair. The tails of the second unbalanced differential transistor pair (M3,M4 also each connect to a shared current source 104 through respective variable resistors 106,108, again scaled in the same proportion as the transistors of the unbalanced pair.

This circuit performs the same function but with a slightly different implementation of the current sources. However, again there is at least one variable resistor between tails of each pair of branches as in the example above.

Various modifications will be apparent to those skilled in the art.

The invention claimed is:

1. A FET RF signal detector circuit comprising:
a first unbalanced differential transistor pair circuit;
a second unbalanced differential transistor pair circuit;
a current mirror output circuit for generating a sensor current and an output current derived from currents flowing in the differential transistor pair circuits;
wherein the first unbalanced differential transistor pair circuit comprises two branches, each with a respective tail, and a first variable resistor between the branch tails, wherein the first unbalanced differential transistor pair circuit connects to a first current source tail arrangement; and
wherein the second unbalanced differential transistor pair circuit comprises two branches, each with a respective tail, and a second variable resistor between the branch tails, wherein the second unbalanced differential transistor pair circuit connects to a second current source tail arrangement; and
wherein the sensor current is subtracted from current output from an additional current source through a resistor.

2. A circuit as claimed in claim 1, wherein the tails of the first unbalanced differential transistor pair circuit each connect to a respective current source of the first current source arrangement, and the tails of the second unbalanced differential transistor pair circuit each connect to a respective current source of the second current source arrangement.

3. A circuit as claimed in claim 2, wherein the first unbalanced differential transistor pair circuit comprises a first transistor and a first current source in the first branch and a second transistor and a second current source in the second branch, with the second transistor having a W/L ratio that is K times the W/L ratio of the first transistor.

4. A circuit as claimed in claim 3, wherein the second unbalanced differential transistor pair circuit comprises a third transistor and a third current source in the first branch and a fourth transistor and a fourth current source in the second branch, with the fourth transistor having a W/L ratio that K times the W/L ratio of the third transistor.

5. A circuit as claimed in claim 1, wherein the tails of the first unbalanced differential transistor pair circuit each connect to a current source of the first current source arrangement through respective variable resistors, and the tails of the second unbalanced differential transistor pair circuit each connect to a current source of the second current source arrangement through respective variable resistors.

6. A circuit as claimed in claim 5, wherein the variable resistors for the first unbalanced differential transistor pair circuit have a resistance ratio equal to a balance ratio of the second differential pair.

7. A circuit as claimed in claim 1, wherein the current mirror output circuit comprises a transistor arrangement for deriving the sensor current which is based on the difference between the total current in the two first branches and the total current in the two second branches.

8. A circuit as claimed in claim 7, wherein the current mirror output circuit further comprises a current mirror arrangement for generating the output current as the difference between the current of the additional current source and the sensor current.

9. A FET RF signal detector arrangement comprising:
an attenuator;
an first detector at the output of the attenuator
a cascaded set of amplifiers;
a plurality of second detectors, each provided at the output of an amplifier, wherein the first and second detectors include a detector circuit as claimed in claim 1; and
a summation unit for summing the detector outputs.

10. An arrangement as claimed in claim 9, comprising a first subset of the amplifiers in cascade after the attenuator as a first cascade branch and a second subset of the amplifiers in cascade after the input as a second cascade branch.

11. An arrangement as claimed in claim 9, wherein the summation unit comprises a current summing unit, and wherein a current to voltage converter is provided at the output of the arrangement.

* * * * *